US006970026B2

(12) United States Patent
Kang

(10) Patent No.: US 6,970,026 B2
(45) Date of Patent: Nov. 29, 2005

(54) POWER-ON RESET CIRCUIT AND METHOD FOR LOW-VOLTAGE CHIPS

(75) Inventor: Tzung-Hung Kang, Hsinchu (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/761,260

(22) Filed: Jan. 22, 2004

(65) Prior Publication Data

US 2004/0189358 A1 Sep. 30, 2004

(30) Foreign Application Priority Data

Mar. 25, 2003 (TW) .................................. 92106697

(51) Int. Cl.[7] ........................ H03K 5/153; H03K 17/22
(52) U.S. Cl. ...................................... 327/143; 327/198
(58) Field of Search ............................... 327/142, 143, 327/198, 39, 40, 43, 47, 49, 102; 323/901

(56) References Cited

U.S. PATENT DOCUMENTS

| | | | | |
|---|---|---|---|---|
| 5,933,036 A | * | 8/1999 | Kim | 327/143 |
| 6,388,479 B1 | * | 5/2002 | Gupta et al. | 327/143 |
| 6,492,849 B2 | * | 12/2002 | Ikoma et al. | 327/143 |

* cited by examiner

Primary Examiner—Kenneth B. Wells
Assistant Examiner—Terry L. Englund
(74) Attorney, Agent, or Firm—Birch, Stewart, Kolasch & Birch, LLP

(57) ABSTRACT

A power-on reset circuit and method for generating a reset signal according to the voltage of a power source. The circuit includes an oscillator for generating an oscillation signal. The frequency of the oscillation signal increases with the rising of the voltage of the power source. The circuit further includes a frequency detector for converting the oscillation frequency of the oscillation signal into a first output voltage, and includes a reset signal output circuit for outputting a reset signal according to the first output voltage. Therefore, the power-on reset circuit can be applied in low-voltage chips.

21 Claims, 4 Drawing Sheets

POWER-ON RESET CIRCUIT AND METHOD FOR LOW-VOLTAGE CHIPS

This Non-provisional application claims priority under 35 U.S.C. §119(a) on Patent Application No(s). 092106697 filed in Taiwan on Mar. 25, 2003, the entire contents of which are hereby incorporated by reference.

BACKGROUND OF THE INVENTION

1. Field of the Invention

The invention relates to a power-on reset circuit and a method thereof, and more particularly to a power-on reset circuit for use in a chip with low operation voltage and a method thereof.

2. Description of the Related Art

In general, there are two methods for generating reset signal at power-on state. One method is to generate the reset signal by a RC delay unit, as shown in the circuit schematic illustration in FIG. 1 and the associated voltage diagram in FIG. 2. The other method is to generate the reset signal by using the threshold voltage of an active device, as shown in the circuit schematic illustration in FIG. 3 and the associated voltage diagram in FIG. 4.

Referring to FIG. 1, the power-on reset circuit includes an RC (resistor & capacitor) voltage divider 11 and a comparator 12. The RC voltage divider 11 includes a resistor 111 and a capacitor 112 and generates an output voltage $V_{RC}$. The RC voltage divider 11 is connected to a voltage source VDD and a ground 13. The comparator 12 receives an input voltage αVDD proportional to the voltage source VDD and the output voltage $V_{RC}$ of the RC voltage divider 11 and generates a reset signal Reset by comparing $V_{RC}$ with αVDD. At the beginning of power on, voltage $V_{RC}$<αVDD and the comparator enables the reset signal Reset, such as outputting a High State. Then, when voltage $V_{RC}$>=αVDD, the comparator disables the reset signal Reset, such as outputting a Low state. As shown in the clock diagram in FIG. 2, when the power is on, the voltage source VDD outputs a transient voltage having a magnitude increasing from 0 as time elapses. At the beginning of power on, voltage $V_{RC}$<αVDD and the comparator enables the reset signal Reset. At the time when the condition of ($V_{RC}$<αVDD) is changed to the condition of ($V_{RC}$>=αVDD), the reset signal Reset is disabled.

Referring to FIG. 3, a power-on reset circuit includes a resistor—metal oxide semiconductor voltage divider 21 and a comparator 22. The resistor—metal oxide semiconductor voltage divider 21 includes a resistor 211 and a metal oxide semiconductor 212 and generates an output voltage $V_{th}$. The resistor—metal oxide semiconductor voltage divider 21 is connected to a voltage source VDD and a ground 23. The comparator 22 compares an input voltage αVDD proportional to the voltage source VDD to the threshold voltage $V_{th}$ and generates a reset signal Reset by comparing $V_{RC}$ with αVDD. When the threshold voltage $V_{th}$ is greater than the input voltage αVDD, the comparator 22 enables the reset signal Reset. However, when the threshold voltage $V_{th}$<=αVDD, the comparator 22 disables reset signal Reset to end the reset state. As shown in FIG. 4, at the beginning of power on, the voltage source VDD outputs a transient voltage having a magnitude increasing from 0 as time elapses. At the beginning, the threshold voltage $V_{th}$>αVDD, the comparator enables the reset signal Reset. At the moment when the condition of ($V_{th}$>αVDD) is changed to the condition of ($V_{th}$<=αVDD), the reset signal Reset is disabled.

However, the above-mentioned conventional power-on reset circuits have the following drawbacks. Usually, for the RC delay circuit, an external capacitor is needed to have enough delay time. For the circuit with the active device, such as the metal oxide semiconductor, the threshold voltage of the active device tends to be changed with the process variation, environment temperature variation, and other conditions. Thus, the conditions of reset signal being disabled are not consistent and may be changed with the variation of the various environment conditions. Consequently, errors may be caused in which the reset signal cannot be disabled, or is not disabled at the proper time. In addition, as the operation voltage of the IC chip gets lower and lower, the operation voltage VDD gets smaller and smaller. Therefore, when the power is on, the transient voltage variation gets smaller and smaller, and thus the tolerance of the threshold voltage variation gets smaller and smaller. Thus, the conventional power-on reset circuits are not suitable for use in the chip with the low operation voltage.

SUMMARY OF THE INVENTION

It is therefore one of the many object of the invention to provide a power-on reset circuit adapted to low-voltage chips. The reset circuit may be applied to the low operation voltage without causing errors in the reset operation after power-on owing to the process variation or temperature variation.

Another object of the invention is to provide a power-on reset circuit adapted to low-voltage chips. The circuit utilizes a ring oscillator, which provides an oscillation frequency that rises as the transient voltage rises, to control the ON/OFF of the switch, to charge/discharge capacitors, and to generate a first voltage by conversion. The first voltage is compared to a second voltage, which is generated after the transient voltage is processed by the voltage divider. Then, it is determined whether or not the circuit has to be reset.

According to one aspect of the invention, a power-on reset circuit adapted to a low operation voltage chip includes an oscillator, a frequency detector, and a reset signal output circuit. A power source provides a transient voltage when it is on, and the transient voltage has the magnitude that rises as time elapses. The oscillator is coupled to the power source. The oscillator generates an oscillation signal having an oscillation frequency that increases as the transient voltage increases. The frequency detector is coupled to the power source and the oscillator. The frequency detector outputs a corresponding first output voltage according to the oscillation frequency of the oscillation signal. The reset signal output circuit outputs a reset signal according to the first output voltage. The magnitude of the reset signal is one of a first level and a second level.

According to another aspect of the invention, a power-on reset method applied to a power-on reset circuit is provided. The power-on reset circuit includes an oscillator, a frequency detector, and a comparator. The method includes the steps of: receiving a transient voltage when a power source is on, wherein the magnitude of the transient voltage increases as time elapses; providing a corresponding oscillation signal according to the transient voltage, wherein the oscillation signal has an oscillation frequency that increases as the transient voltage increases; outputting a corresponding first output voltage according to the oscillation signal; comparing the first output voltage to a second output voltage; enabling a reset signal when the first output voltage is greater than the second output voltage; and disabling the reset signal when the first output voltage is equal to or smaller than the second output voltage.

DETAILED DESCRIPTION OF THE INVENTION

Figure 1:
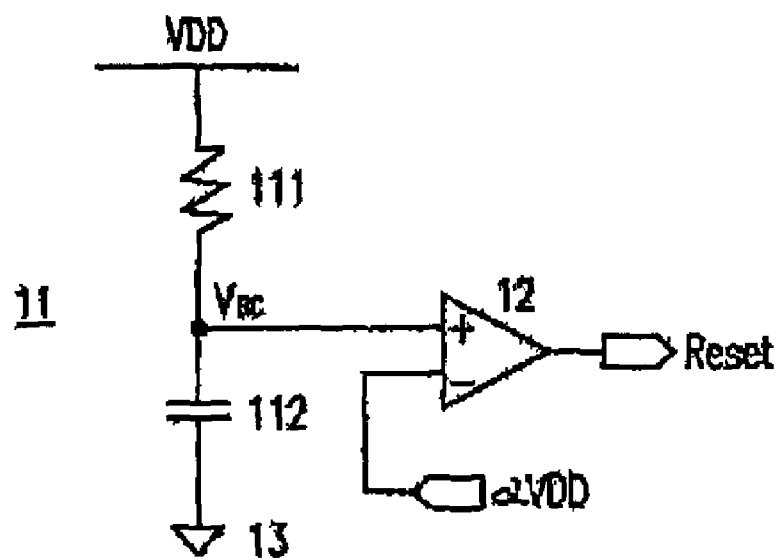
FIG. 1 shows a schematic illustration of a conventional power-on reset circuit using a RC delay unit.
Figure 2:
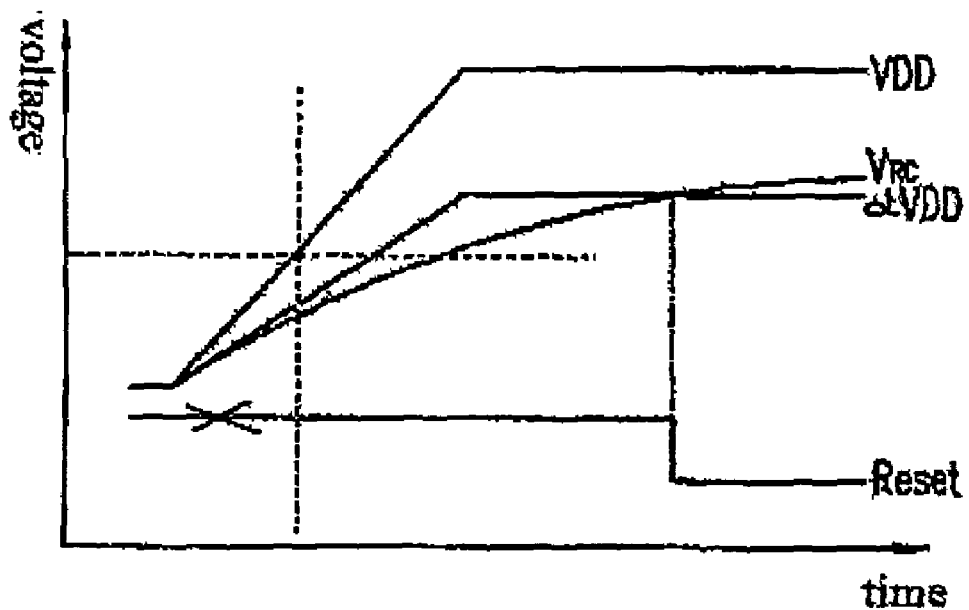
FIG. 2 shows an associated voltage clock diagram of the conventional power-on reset circuit in FIG. 1.
Figure 3:
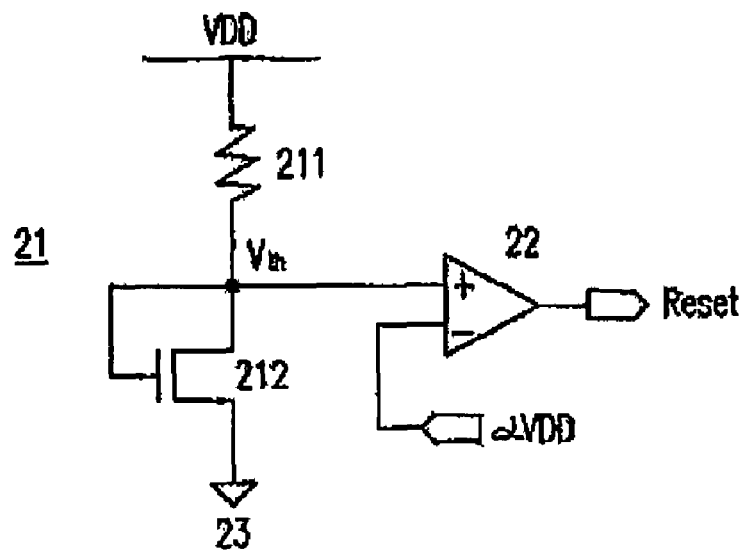
FIG. 3 shows a schematic illustration of a conventional power-on reset circuit using a threshold voltage of a metal oxide semiconductor.
Figure 4:
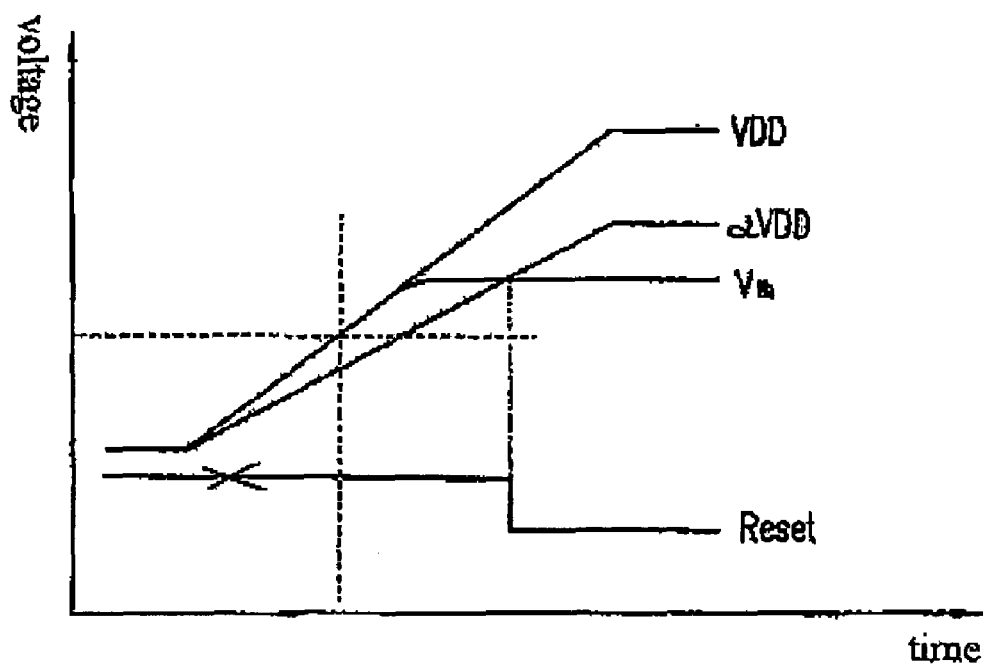
FIG. 4 shows an associated voltage clock diagram of the conventional power-on reset circuit in FIG. 3.
Figure 5:
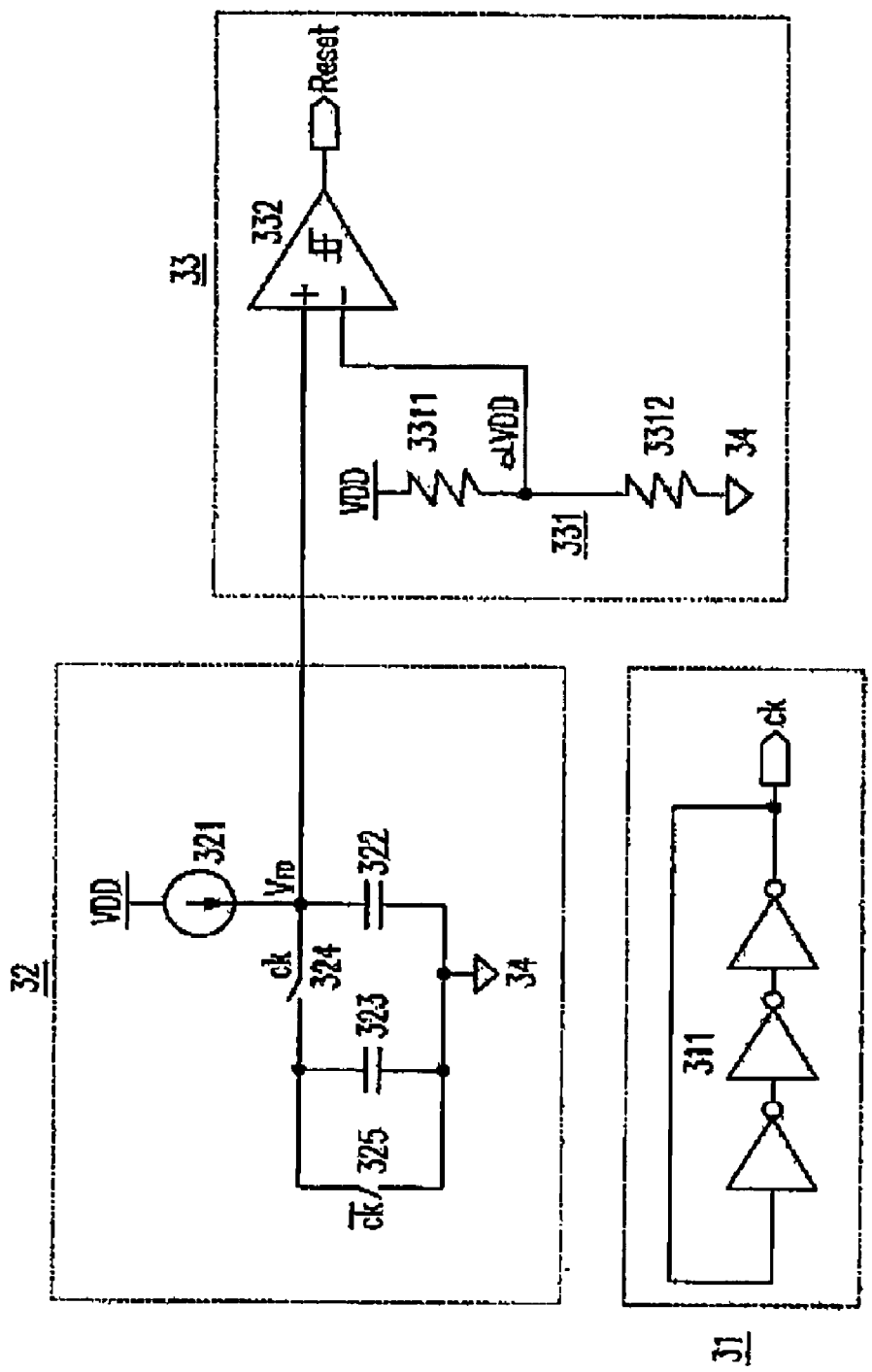
FIG. 5 shows a schematic illustration of a power-on reset circuit according to an embodiment of the invention.

Referring to FIG. 5, the circuit of the embodiment of the present invention includes an oscillator 31, a frequency detector 32 and a comparator circuit 33. The oscillator 31 can be a ring-oscillator and includes a set of at least three odd-numbered and serially connected inverters 311, and the output terminal of the last inverter is connected to the input terminal of the first inverter. The oscillator 31 may also be a voltage-controlled oscillator (VCO). Each inverter is powered by a voltage source VDD. The oscillator 31 generates an oscillation signal ck. The frequency detector 32 is coupled to the voltage source VDD and a ground 34 and includes a current source 321, a first capacitor 322, a second capacitor 323, a first switch 324 and a second switch 325. The frequency detector 32 outputs a first output voltage $V_{FD}$ according to the oscillation signal ck generated by the oscillator 31. The current source 321 is coupled to the voltage source VDD. The first capacitor 322 has a first terminal coupled to the output terminal of the current source 321, and a second terminal coupled to the ground 34. The second capacitor 323 and the first capacitor 322 are commonly connected to the ground 34. The first switch 324 is coupled to the first terminal of the first capacitor 322 and another terminal of the second capacitor 323. The second switch 325 and the second capacitor 323 are connected in parallel. The comparator circuit 33 includes a resistor—voltage divider 331 and a comparator 332 and generates a reset signal Reset. The resistor—voltage divider 331 is coupled to the voltage source VDD and generates a second output voltage αVDD proportional to the voltage source VDD with a first resistor 3311 and a second resistor 3312. The comparator 332 compares the first output voltage $V_{FD}$ to the second output voltage αVDD. When the first output voltage $V_{FD}$ is greater than the second output voltage αVDD, the comparator 332 enables the reset signal Reset, such as outputting a High state; and when the first output voltage $V_{FD}$ is smaller than or equal to the second output voltage αVDD, the comparator 332 disables the reset signal Reset, such as outputting a Low state.

In this embodiment, when the power is on, the voltage source VDD is at a transient voltage having the magnitude that increases from 0 as time elapses. The oscillation frequency of the oscillation signal ck of the oscillator 31 increases with the rising of the transient voltage. The oscillation frequency thereof also decreases with the increasing of the number of the cascaded inverters in the oscillator 31. Thus, the magnitude of the transient voltage input to the inverters and the number of the cascaded inverters will determine the oscillation frequency of the oscillation signal ck. In the frequency detector 32, the switching operations of the first switch 324 and the second switch 325 are controlled by the oscillation signal ck. The state of the first switch 324 is opposite to that of the second switch 325. That is, when the first switch 324 is ON, the second switch 325 is OFF and vice versa. Therefore, the ON/OFF states of the first switch 324 and the second switch 325 alternate with the oscillation frequency of the oscillation signal ck and the switching states of the first switch 324 and the second switch 325 are different.

In the circuit implementation of this embodiment, the first switch 324 substantially switches according to the oscillation signal ck while the second switch 325 substantially switches according to an inverse signal of the oscillation signal ck, as shown in FIG. 5. The frequency detector 32 has a current source 321 and two capacitors 322, 323 coupled in parallel via the first switch 324. When the states of the first switch 324 and the second switch 325 alternate with the oscillation signal ck, the current source 321 charges/discharges the first/second capacitor 322/323 according to the states of the first switch 324 and the second switch 325, respectively. When the oscillation frequency of the oscillation signal ck is lower, the charge/discharge time of the first/second capacitor 322/323 is longer. In this case, the magnitude of the first output voltage $V_{FD}$ approximates the transient voltage of the voltage source VDD. When the oscillation frequency of the oscillation signal ck is higher, the charge/discharge time of the first/second capacitor 322/323 is shorter. In this case, the first output voltage $V_{FD}$ is smaller than the transient voltage of the voltage source VDD, and decreases with the increasing of the oscillation frequency of the oscillation signal ck. If the current of the current source 321 in the frequency detector 32 is I, and the first capacitor 322 has a capacitance $C_1$, the second capacitor 323 has a capacitance $C_2$, the oscillation signal ck has an oscillation frequency $f_{ck}$, then the magnitude of the first output voltage $V_{FD}$ generated by the frequency detector 32 is:

$$V_{FD}=(I/f_{ck})*((2*C_1+C_2)/(C_1*C_2)).$$

According to the above-mentioned equation, the first output voltage $V_{FD}$ of the frequency detector 32 is inversely proportional to the oscillation frequency $f_{ck}$ of the oscillation frequency ck. So, when the value $f_{ck}$ of the oscillation frequency ck is higher, the first output voltage $V_{FD}$ is lower.

Since the operation principle and manner of the comparator circuit 33 are similar to those of the conventional power-on reset circuit, detailed description thereof may be found in the above-mentioned description and will be omitted.

Figure 6:
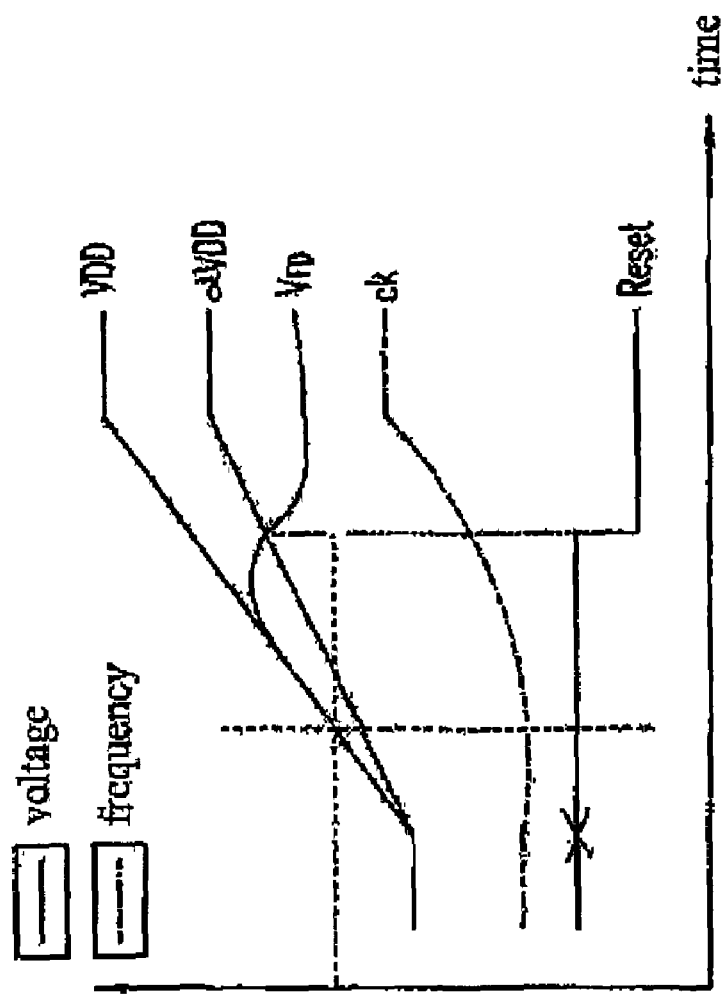
FIG. 6 shows an associated voltage and frequency clock diagram of the power-on reset circuit according to the embodiment of the invention.

It is to be noted that in this invention, the comparator circuit 33 also may be implemented by an inverter. The inverter receives the first output voltage $V_{FD}$ and determines the level of the output reset signal according to the magnitude of the first output voltage $V_{FD}$. When the power source is just started, the value of the first output voltage $V_{FD}$ is smaller than a default threshold value of the inverter, At this time, the inverter regards the first output voltage $V_{FD}$ as a low-level signal and inversely outputs a high-level signal to enable the reset signal Reset. Because the value of the first output voltage $V_{FD}$ increases as time elapses, when the value of the first output voltage $V_{FD}$ is greater than the default threshold value of the inverter, the inverter regards the first output voltage $V_{FD}$ as a high level signal and inversely outputs a low-level signal to disable the reset signal Reset. In this embodiment, the working principle of the power-on reset circuit in FIG. 5 is illustrated in FIG. 6.

The oscillation frequency of the oscillation signal ck output from the oscillator 31 relates to the magnitude of the voltage source VDD. When the voltage source VDD is lower, the oscillation frequency $f_{ck}$ of the oscillation signal ck output from the oscillator 31 is also lower. According to the above-mentioned equation for the first output voltage $V_{FD}$, the first output voltage $V_{FD}$ approximates to the voltage source VDD, so the first output voltage $V_{FD}$ is greater than $\alpha$VDD. When the first output voltage $V_{FD}$ is greater than $\alpha$VDD, the comparator 332 enables the reset signal Reset. At this time, the digital circuit that needs to be reset on the chip is in a reset state. With the rising of the voltage source VDD, the oscillation frequency $f_{ck}$ of the oscillation signal ck increases. In this case, the first output voltage $V_{FD}$ gradually decreases. When the first output voltage $V_{FD}$ decreases to be smaller than or equal to $\alpha$Vdd, the comparator 332 disables the reset signal Reset. That is, the reset is disabled while the digital circuit may start to work. In practice, in the above-mentioned circuit, the current source 321 may be replaced by a resistor, the comparator 332 also may be replaced by an inverter to make the circuit operable under a lower operation voltage.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A power-on reset circuit for generating a reset signal according to a voltage of a power source, the power-on reset circuit comprising:
   an oscillator coupled to the power source for generating an oscillation signal having an oscillation frequency that increases as the voltage of the power source increases;
   a frequency detector coupled to the power source and the oscillator for outputting a corresponding first output voltage according to the oscillation frequency of the oscillation signal; and
   a reset signal generator for generating the reset signal according to the first output voltage.

2. The power-on reset circuit according to claim 1, wherein the oscillator is a ring oscillator.

3. The power-on reset circuit according to claim 2, wherein the ring oscillator comprises a plurality of inverters connected in series to form a ring cascade, and the number of the inverters is an odd number greater than one.

4. The power-on reset circuit according to claim 1, wherein the oscillator is a voltage-controlled oscillator.

5. The power-on reset circuit according to claim 1, wherein the frequency detector comprises:
   a current source coupled to the power source;
   a first capacitor having a first terminal coupled to the current source, and a second terminal that is grounded;
   a second capacitor having a first terminal grounded and a second terminal;
   a first switch coupled to the first terminal of the first capacitor and the second terminal of the second capacitor; and
   a second switch coupled in parallel to the second capacitor;
   wherein the first output voltage is output from the first terminal of the first capacitor.

6. The power-on reset circuit according to claim 5, wherein the first switch and the second switch are controlled by the oscillation signal, the second switch is OFF when the first switch is ON, and the second switch is ON when the first switch is OFF.

7. The power-on reset circuit according to claim 5, wherein the magnitude of the first output voltage is inversely proportional to the oscillation frequency of the oscillation signal.

8. The power-on reset circuit according to claim 5, wherein the current source is a resistor.

9. The power-on reset circuit according to claim 1, wherein the power-on reset circuit is utilized to reset a digital circuit.

10. The power-on reset circuit according to claim 1, wherein the reset signal generator is a comparator circuit.

11. The power-on reset circuit according to claim 10, wherein the comparator circuit is coupled to the frequency detector and outputs the corresponding reset signal according to the first output voltage and a second output voltage, wherein the reset signal is enabled when the first output voltage is greater than the second output voltage, and the reset signal is disabled when the first output voltage is smaller than the second output voltage.

12. The power-on reset circuit according to claim 11, wherein the magnitude of the second output voltage is in fixed proportion to the voltage of the power source.

13. The power-on reset circuit according to claim 12, further comprising a voltage divider to generate the second output voltage.

14. (Original) The power-on reset circuit according to claim 13, wherein the voltage divider comprises:
   a first resistor coupled to the power source; and
   a second resistor having a first terminal coupled to the first resistor and a second terminal tat is grounded;
   wherein the second output voltage is output from the first terminal of the second resistor, and the magnitude of the second output voltage is determined by resistances of the first resistor and the second resistor.

15. The power-on reset circuit according to claim 1, wherein the reset signal generator is an inverter for outputting the reset signal according to the first output voltage.

16. A power-on reset method comprising the steps of:
   applying a voltage of a power source;
   providing an oscillation signal according to the voltage of the power source, wherein the oscillation signal has an oscillation frequency that increases as the voltage of the power source increases;
   outputting a first output voltage according to the oscillation frequency of the oscillation signal; and
   comparing the first output voltage to a second output voltage for outputting a reset signal.

17. The power-on reset method according to claim 16 wherein the first output voltage is determined by a mathematical function inversely proportional to the oscillation frequency of the oscillation signal.

18. The power-on reset method according to claim 16 wherein the second output voltage is proportional to the voltage of the power source.

19. A method for generating a power-on reset signal, the method comprising the steps of:
- receiving a voltage of a power source;
- providing an oscillation signal according to the voltage of the power source, wherein the oscillation signal has an oscillation frequency that changes as the voltage of the power source changes;
- outputting a first output voltage according to the oscillation frequency of the oscillation signal; and
- detecting the first output voltage to generate the power-on reset signal.

20. The method of claim 19, wherein the first output voltage is determined by a mathematical function inversely proportional to the oscillation frequency of the oscillation signal.

21. The method of claim 19, wherein the step of detecting the first output voltage comprises:
- comparing the first output voltage to a threshold voltage to generate the reset signal.

* * * * *